United States Patent
Shinkai

(10) Patent No.: US 6,381,190 B1
(45) Date of Patent: Apr. 30, 2002

(54) SEMICONDUCTOR MEMORY DEVICE IN WHICH USE OF CACHE CAN BE SELECTED

(75) Inventor: Eiji Shinkai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/568,747

(22) Filed: May 11, 2000

(30) Foreign Application Priority Data

May 13, 1999 (JP) .......................................... 11-133186

(51) Int. Cl.$^7$ .............................................. G06F 13/00
(52) U.S. Cl. ............................ 365/230.03; 365/189.01; 711/104
(58) Field of Search ........................ 365/230.03, 189.04, 365/189.03, 189.01; 711/104; 710/22, 27, 28, 38, 107

(56) References Cited

U.S. PATENT DOCUMENTS

| | | | | |
|---|---|---|---|---|
| 4,933,846 A | * | 6/1990 | Humphrey et al. | .......... 710/107 |
| 5,260,555 A | * | 11/1993 | Sakamoto | ..................... 235/492 |
| 5,319,595 A | * | 6/1994 | Saruwatari | ............. 365/189.01 |
| 5,475,860 A | * | 12/1995 | Ellison et al. | ................. 710/26 |
| 5,631,871 A | * | 5/1997 | Park et al. | ................... 365/203 |
| 5,918,069 A | * | 6/1999 | Matoba | ......................... 710/21 |
| 5,970,021 A | * | 10/1999 | Sakurai | ....................... 365/233 |

FOREIGN PATENT DOCUMENTS

| | | |
|---|---|---|
| JP | 6-161932 | 6/1994 |
| JP | 9-237223 | 9/1997 |

* cited by examiner

*Primary Examiner*—Hong Kim
(74) *Attorney, Agent, or Firm*—Hutchins, Wheeler & Dittmar

(57) ABSTRACT

A semiconductor memory device, includes a plurality of banks, each of which includes a memory cell array and a sense amplifier section, a plurality of channel memories, a data control circuit, a first bus provided between the plurality of banks and the plurality of channel memories, a second bus provided between the plurality of channel memories and the data control circuit, and a third bus between the plurality of banks and the data control circuit. The data control circuit outputs write data to the sense amplifier section of a specified one of the plurality of banks via the third bus in a direct write access mode, and inputs read data from the sense amplifier section of a specified one of the plurality of banks via the third bus in a direct read access mode. Also, the data control circuit outputs write data to the sense amplifier section of a specified one of the plurality of banks via the second bus, a specified one of the plurality of channel memories and the first bus in an indirect write access mode, and inputs read data from the sense amplifier section of a specified one of the plurality of banks via the first bus, a specified one of the plurality of channel memories and the second bus in an indirect read access mode.

16 Claims, 2 Drawing Sheets

SEMICONDUCTOR MEMORY DEVICE IN WHICH USE OF CACHE CAN BE SELECTED

BACKGROUND OF THE INVENTION

1. Field of the Invention

The present invention relates to a data processing system using a semiconductor device, and more particularly to a semiconductor memory device in which use of a cache memory can be selected and a data processing system using the semiconductor memory device.

2. Description of the Related Art

A semiconductor memory device with a cache memory as well as memory cells is conventionally known, as shown in FIG. 1. In such a conventional semiconductor memory device, for example, a data is read out from the memory cells of a memory cell array 101 in a Bank A to a sense amplifier section 102 and sensed. The sense data are transferred to one of cache memories 103 such as channel memories. The cache memory 103 is a register array as a channel constituted by SRAMs (static random access memory). The stored data are read out from the cache memory 103, and are then outputted as a read data from an input/output circuit 106 via a data control circuit 104 and a latch circuit 105. On the other hand, write data are inputted into the input/output circuit 106, and is then written into one of the cache memories 103 via the latch control circuit 105 and the data control circuit 104. Then, the write data are transferred from the cache memory 103 to the sense amplifier section 102. Finally, the write data are stored in memory cells of the memory cell array.

In the conventional semiconductor memory device, when the data are read out from the memory cells 101 and also the data are written into the memory cells 101, the data are temporarily stored in one of the cache memories 103. As a consequence, the data transfer speed executed via the cache memory 103 would be strongly restricted depending on the cache memory 103.

In conjunction with the above description, an input/output control system is disclosed in Japanese Laid Open Patent Application (JP-A-Heisei 6-161932). In this reference, a digital data processor is composed of two functional units and a controller, and data are transferred between them. Each functional unit has a related memory element such as a random access main memory. A first functional unit is composed of a transmission element (sender) which generates a message descriptor block (MDB) transmission signal which specifies one or more addresses to the related memory to which data should be transferred. The controller distinguishes the MDB transmission signal which matches with a selected MDB reception signal and generates a signal to carry out a data transfer between the corresponding memory positions of the first and second functional units which are specified based on the matched MDB signal. Thus, the improvement in the data transfer efficiency between the digital data processing functional units is aimed.

Also, a computer system using a bus bridge is disclosed in Japanese Laid Open Patent Application (JP-A-Heisei 9-237223). In this reference, a read request is outputted from a bus master unit to a main memory 5 via a second bus 8. At this time, when it is informed by a cache test section 10 that a cache write back is necessary, a cache write back data is written from a write back control section 12 back to the main memory unit 5 via a main memory control unit 21. At the same time, the cache write back data is also transferred to a data by-pass section 22. The data for the read request is taken directly into a second bus control section 9 via the by-pass section 22 and transferred to a bus master unit via the IO bus 8. Thus, a data read from the main memory unit 5 is avoided.

SUMMARY OF THE INVENTION

Therefore, an object of the present invention is to provide a semiconductor memory device with a cache memory in which a data can be read out from and written in a memory cell without passing through the cache memory.

Another object of the present invention is to provide a semiconductor memory device in which a restriction of data transfer speed due to a cache memory can be released.

Still another object of the present invention is to provide a semiconductor memory device in which a memory cell array can be accessed without passing through a cache memory when a row address continuously changes.

Yet still another object of the present invention is to provide a data processing system using the semiconductor memory device in either of the above.

In order to achieve an aspect of the present invention, a semiconductor memory device, includes a plurality of banks, each of which includes a memory cell array and a sense amplifier section, a plurality of channel memories, a data control circuit, a first bus provided between the plurality of banks and the plurality of channel memories, a second bus provided between the plurality of channel memories and the data control circuit, and a third bus between the plurality of banks and the data control circuit. The data control circuit outputs write data to the sense amplifier section of a specified one of the plurality of banks via the third bus in a direct write access mode, and inputs read data from the sense amplifier section of a specified one of the plurality of banks via the third bus in a direct read access mode. Also, the data control circuit outputs write data to the sense amplifier section of a specified one of the plurality of banks via the second bus, a specified one of the plurality of channel memories and the first bus in an indirect write access mode, and inputs read data from the sense amplifier section of a specified one of the plurality of banks via the first bus, a specified one of the plurality of channel memories and the second bus in an indirect read access mode.

Here, each of the first to third buses includes a bus driver. At this time, the bus drivers of the first and second buses may be set to an enable state in the indirect write access mode and the indirect read access mode, and may be set to a disable state in the direct write access mode and the direct read access mode. Also, the bus driver of the third bus may be set to an enable state in the direct write access mode and the direct read access mode, and may be set to a enable state in the indirect write access mode and the indirect read access mode. In this case, the data control circuit may include a flag used to specify one of an indirect access mode and a direct access mode based on an access mode specify internal command. The indirect access mode includes the indirect write access mode and the indirect read access mode, and the direct access mode includes the direct write access mode and the direct read access mode.

Also, the semiconductor memory device may further include an internal command generating section generating the access mode specify internal command based on a signal supplied to a first specific external input terminal. In this case, the internal command generating section may generate an operation mode specify internal command based on signals supplied to second specific external input terminals to set one of a write mode and a read mode.

Alternately, the semiconductor memory device may further include an internal command generating section generating the access mode specify internal command based on signals supplied to specific external input terminals.

In order to achieve another aspect of the present invention, a method of accessing a semiconductor memory device, is attained by setting a direct write access mode in response to a direct access internal command and a write internal command; by setting a direct read access mode in response to the direct access internal command and a read internal command; by setting an indirect write access mode in response to an indirect access internal command and the write internal command; by setting an indirect read access mode in response to the indirect access internal command and the read internal command; by accessing a specific memory cell array such that write data externally supplied is written into the specific memory cell array via a data control circuit, a first bus and a sense amplifier section for the specific memory cell array in the direct write access mode; by accessing the specific memory cell array such that read data is read out from the specific memory cell array via the sense amplifier section for the specific memory cell array, the first bus, and the data control circuit in the direct read access mode; by accessing the specific memory cell array such that the write data externally supplied is written into the specific memory cell array via the data control circuit, a second bus, a specific channel memory, a third bus and the sense amplifier section for the specific memory cell array in the indirect write access mode; and by accessing the specific memory cell array such that read data is read out from the specific memory cell array via the sense amplifier section for the specific memory cell array, the third bus, the specific channel memory, the second bus, and the data control circuit in the indirect read access mode.

In this case, each of the first to third buses may include a bus driver. At this time, each of the setting a direct write access mode and the setting a direct read access mode includes: setting the bus drivers of the second and third buses to a disable state; and setting the bus drivers of the first bus to an enable state. Also, each of the setting an indirect write access mode and the setting an indirect read access mode includes: setting the bus drivers of the second and third buses to an enable state; and setting the bus drivers of the first bus to a disable state.

Also, the method may further include: selectively generating one of the direct access internal command and the indirect access internal command based on a signal supplied to a first specific external input terminal. In this case, the method may further include: selectively generating one of the write internal command and the read internal command based on signals supplied to second specific external input terminals.

Alternately, the method may further include: selectively generating one of the direct access internal command, the indirect access internal command, the write internal command and the read internal command based on signals supplied to second specific external input terminals.

In order to achieve still another aspect of the present invention, a data processing system includes a control unit and a semiconductor memory device. The control unit determines whether or not data processing is to be executed for a data block, generates an external direct access command when it is determined that the data processing is to be executed for the data block, and generates an external indirect access command when it is determined that the data processing is not executed for the data block. The semiconductor memory device sets one of an indirect write access mode, an indirect read access mode, a direct write access mode and a direct read access mode based on the external direct access command or the external direct access command, and whether the data processing relates to a write operation or a read operation. The semiconductor memory device includes a plurality of banks, each of which includes a memory cell array and a sense amplifier section, and a specific one of the plurality of banks for the data block including a specific memory cell array and a specific sense amplifier section; a plurality of channel memories; a data control circuit; a first bus provided between the plurality of banks and the plurality of channel memories; a second bus provided between the plurality of channel memories and the data control circuit; and a third bus between the plurality of banks and the data control circuit. The data control circuit sends first write data of the data block from the control unit to the specific sense amplifier section via the third bus in the direct write access mode, receives first read data of the data block from the specific sense amplifier section via the third bus in the direct read access mode, sends second write data to the sense amplifier section of a specified one of the plurality of banks via the second bus, a specified one of the plurality of channel memories and the first bus in the indirect write access mode, and receives second read data from the sense amplifier section of a specified one of the plurality of banks via the first bus, a specified one of the plurality of channel memories and the second bus in the indirect read access mode.

In this case, each of the first to third buses includes a bus driver. The bus drivers of the first and second buses are set to an enable state in the indirect write access mode and the indirect read access mode, and set to a disable state in the direct write access mode and the direct read access mode. Also, the bus driver of the third bus is set to an enable state in the direct write access mode and the direct read access mode, and set to a enable state in the indirect write access mode and the indirect read access mode.

Also, the data control circuit includes a flag used to specify one of an indirect access mode and a direct access mode based on an access mode specify internal command. The indirect access mode includes the indirect write access mode and the indirect read access mode, and the direct access mode includes the direct write access mode and the direct read access mode.

Also, the semiconductor memory device may further include: an internal command generating section generating the access mode specify internal command based on the external indirect access command or the external direct access command from the control unit.

Also, the internal command generating section generates an operation mode specify internal command based on whether the data processing is for the write operation and the read operation.

DESCRIPTION OF THE PREFERRED EMBODIMENTS

Hereinafter, a data processing system using a semiconductor memory device such as a DRAM of the present invention will be described below in detail with reference to the attached drawings.

Figure 1:
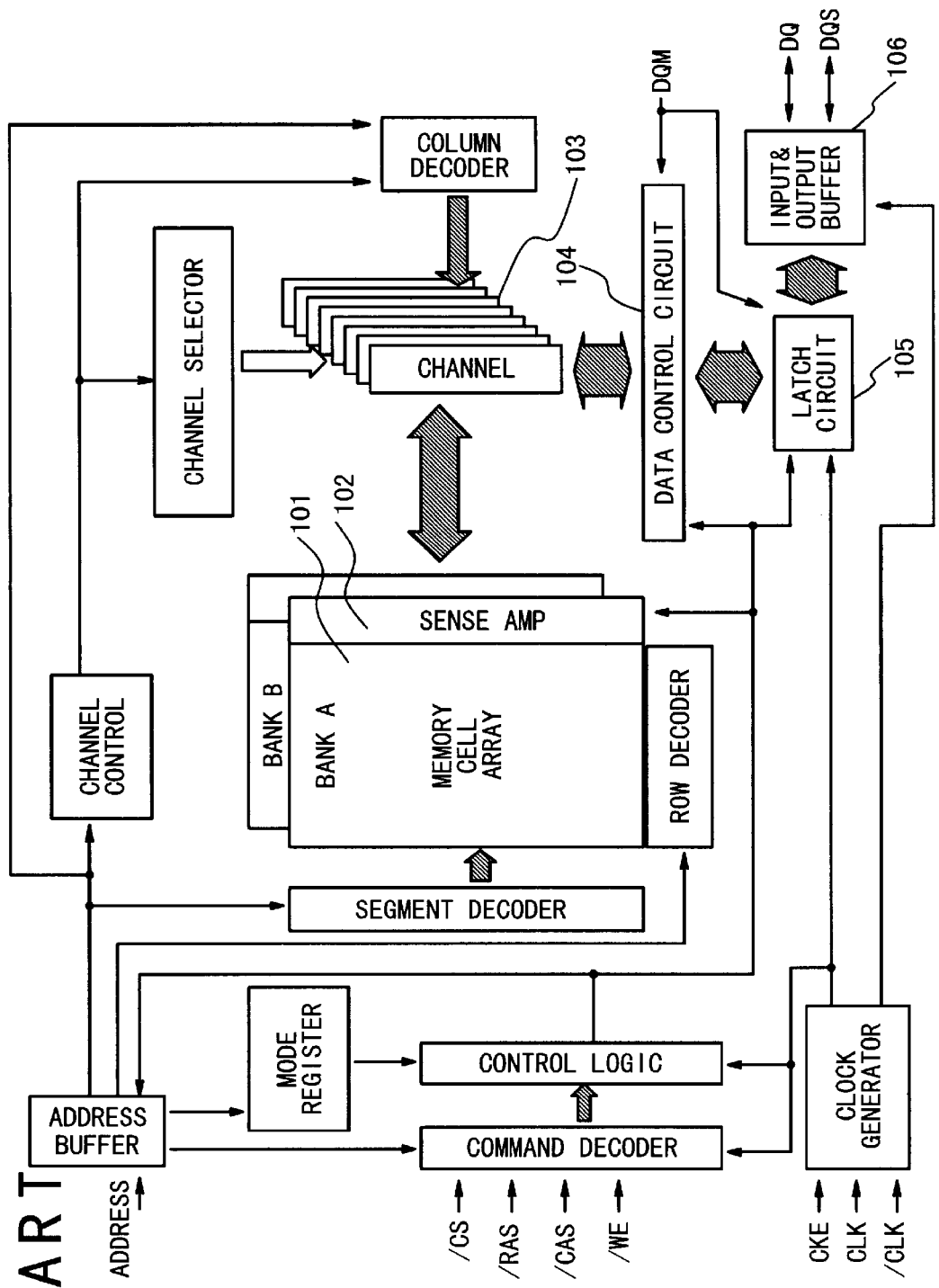
FIG. 1 is a circuit block diagram showing the structure of a conventional semiconductor memory device.
Figure 2:
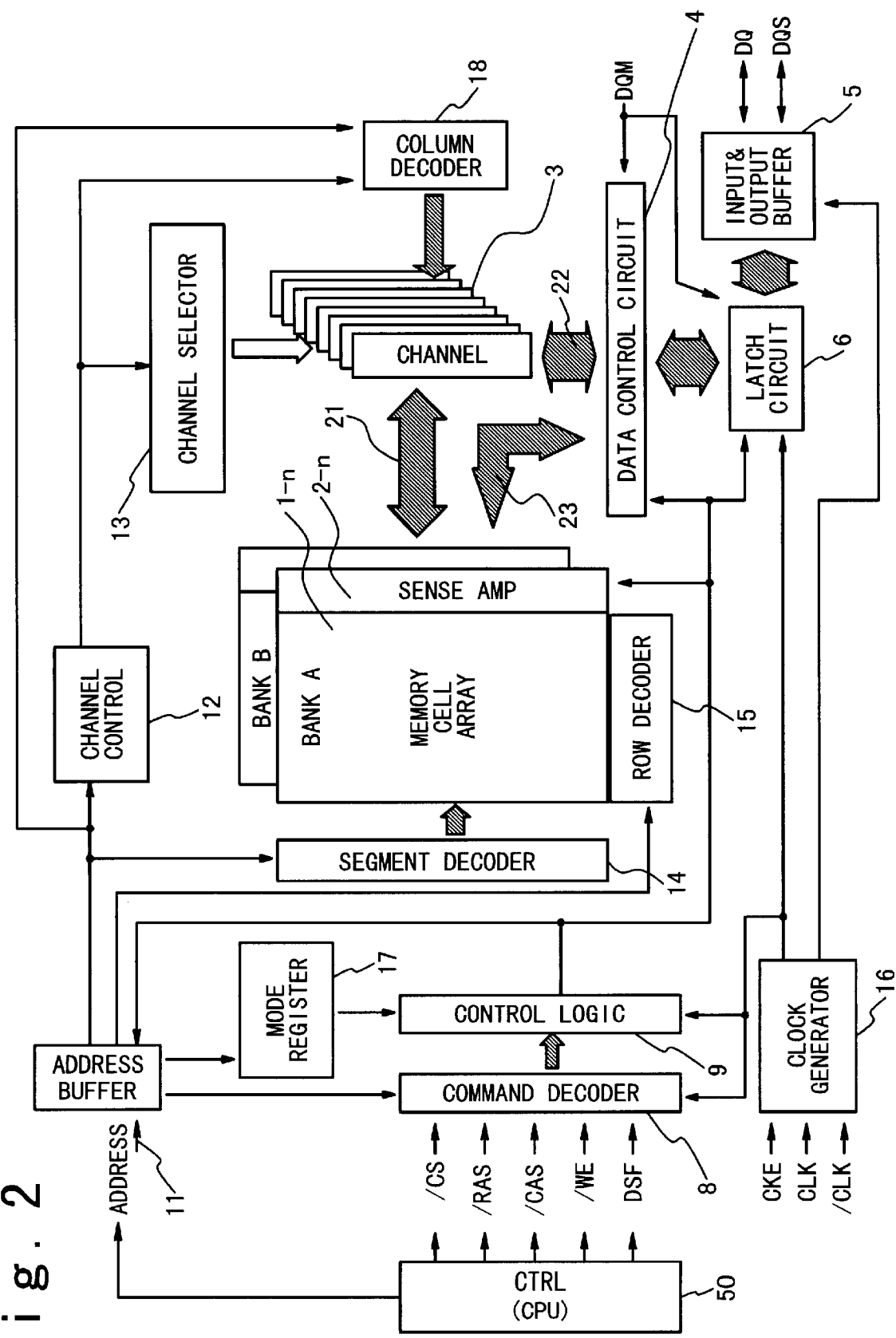
FIG. 2 is a circuit block diagram showing the structure of a data processing system using a semiconductor memory device according to an embodiment of the present invention.

FIG. 2 shows the structure of a data processing system using the semiconductor memory device according to an embodiment mode of the present invention. Referring to FIG. 2, the data processing system is composed of a control unit 50 including a CPU and the semiconductor memory device. The control unit 50 outputs an address, a clock control signal CKE, clock signals CLK and /CLK, and control signals /CS, /RAS, /CAS, /WE and DSF. Also, the control unit 50 inputs and outputs data derived from data signals DQ and DQS.

The semiconductor memory device is composed of a clock generator 16, a command decoder 8, a control logic 9, a mode register 17, and an address buffer 11. The semiconductor memory device is further composed of a segment decoder 14, a channel controller 12, a channel selector 13, a column decoder 18, channels 3-i (i=1 to n), and a plurality of banks 1-i (i=1 to n). Each of the plurality of banks is composed of a row decoder 15, a sense amplifier section 2, and a memory cell array 1. The semiconductor memory device is further composed of a data control circuit 4, a latch circuit 6 and an input and output buffer 5. Buses 21 to 23 are provided between the sense amplifier sections 2 and the channels 3, between the channels 3 and the data control circuit 4, and between the sense amplifier sections 2 and the data control circuit 4. Each of the buses 21 and 22 includes a bus driver (not shown) which is set to an enable state in an indirect access mode and to a disable state in a direct access mode. Also, the bus 23 includes a bus driver (not shown) which is set to an enable state in the direct access mode and to a disable state in the indirect access mode.

The clock generator 16 receives the external clock signals CLK and /CLK and an external clock control signal CKE from the control unit 50. The clock generator 16 is set to an enable state in response to the clock control signal CKE. The clock generator 16 generate clock signals based on the clock signals CLK and /CLK in the enable state. The generated clock signals are supplied to the command decoder 8 and the control logic 9, the latch circuit 6 and the input and output buffer 5. The address buffer 11 receives an external address from the control unit 50 and an internal command to output the address or a control data signal to the channel controller 12, the column decoder 18, the segment decoder 14, the segment decoder 14, the mode register 17 and the command decoder 8. The mode register sets a normal mode or a test mode based on the control data signal from the address buffer 11.

The command decoder 8 receives a chip select signal /CS, a row address strobe signal /RAS, a column address strobe signal /CAS, a write enable signal /WE, and a driver selection flag signal DSF from the control unit 50. Also, the command decoder 8 receives the control data signal from the address buffer 11. The command decoder 8 outputs an external command to the control logic 9 based on these signals. The control logic 9 generates an internal command based on the external command from the command decoder 8 and the mode set by the mode register 17. The generated internal command is outputted to the address buffer 11, the sense amplifier section 2, the data control circuit 4 and the latch circuit 6. In this case, when a high level signal is supplied as the driver selection flag signal, a driver selection flag (not shown) in the data control circuit 4 is set. Also, when a low level signal is supplied as the driver selection flag signal, the driver selection flag in the data control circuit 4 is reset.

The segment decoder 14 selects one of the plurality of banks based on the address from the address buffer 11. The row decoder 15 decodes the address from the address buffer 11 to specify one of word lines, to which memory cells are connected. The channel controller 12 generates a channel control signal based on the address from the address buffer 11 to output to the channel selector 13 and the column decoder 18. The channel selector 13 generates a channel selection signal based on the channel control signal. Thus, one of the plurality of channels 3 is selected based on the channel selection signal. The column decoder 18 decodes the address from the address buffer 11 and the channel selection signal to one of the channels 3.

The input and output buffer 5 inputs and outputs data signals DQ and DQS corresponding to write data and read data from and to the control unit 50 in response to the clock signal from the clock generator 16. The latch circuit 6 latches data signals from the input output buffer 5 or the data control circuit based on the internal command from the control logic 9 and a data mask signal DQM in synchronous with the clock signal from the clock generator 16. The data mask signal DQM is generated in the semiconductor device and is used to set the latch circuit 6 and the data control circuit 4 to a disable state. The latch circuit 6 and the data control circuit 4 do not operate in the disable state.

The data control circuit 4 includes the driver selection flag (not shown). The data control circuit 4 sets the buses 21 and 22 to the enable state and the bus 23 to the disable state in the indirect access mode which is specified by the driver selection flag. Also, the data control circuit 4 sets the buses 21 and 22 to the disable state and the bus 23 to the enable state in the direct access mode which is specified by the driver selection flag. The data control circuit 4 outputs data signals from the latch circuit 6 to the sense amplifier section 2 or from the sense amplifier section 2 to the latch circuit 6 based on the internal command and the signal DQM in the direct mode. Also, the data control circuit 4 outputs data signals from the latch circuit 6 to the sense amplifier section 2 via the channel memory 3 or from the sense amplifier section 2 to the latch circuit 6 via the channel memory 3 based on the internal command and the signal DQM in the indirect mode.

Next, the operation of the data processing system using the semiconductor memory device of the present invention will be described.

The control unit 50 outputs the chip select signal /CS and the driver selection flag signal DSF as an external direct access command or an external indirect access command based on a data to be processed. Also, the control unit 50 outputs the signals /RAS and /CAS and the write enable signal /WE as an external write command or an external read command based on the processing.

In the semiconductor memory device, the internal commands are generated based on the external direct access command, the external indirect access command, the external write command and the external read command. A read mode, a write mode, a direct access mode and an indirect access mode are set based on the generated internal commands.

In the read mode and the indirect access mode, one of the plurality of banks is specified by the segment decoder 14 based on the address from the address buffer 11. Memory cells of the specified bank are specified by the row decoder 15 based on the address from the address buffer 11. Data stored in the specified memory cells of the memory cell array 1 of the specified bank 1 are sensed as data signals by a sense amplifier section 2 for the specified bank 1. The data signals sensed by the sense amplifier section 2 are transferred to locations specified by the column decoder 18 in one of the channel memories 3 specified by the channel selector 13 as virtual channel memory through the bus 21 in the indirect access mode. The data signals stored in the channel memory 3 are transferred to the data control circuit 4 via the bus 22 based on the signal DQM and the internal command from the control logic 9. The latch circuit 6 latches the data signals in response to the clock signal from the clock generator 16 based on the signal DQM and the internal command from the control logic 9 to output to the input and output buffer 5. The data signals are outputted from the input and output buffer 5 as the signals DQ and DQS. Thus, the read data corresponding to the data signals DQ and DQS is outputted to the control unit 50.

Also, in the write mode and the indirect access mode, data signals corresponding to the write data from the control unit 50 are inputted to the input and output buffer 5 based on the clock signal from the clock generator 16 and latched by the latch circuit 6 in response to the clock signal from the clock generator 16 based on the signal DQM and the internal command. The latched data signals are stored in the locations specified by the column decoder 18 in the channel memory 3 specified by the channel selector through the data control circuit 4 and the bus 22. The data signals stored in the channel memory 3 are transferred via the bus 21 to the sense amplifier section 2 of the bank which is specified by the segment decoder 14. Thus, write data corresponding to the data signals are stored in memory cells connected to the word line specified by the row decoder 15.

In the read mode and the direct access mode, memory cells are specified by the row decoder 15. Data stored in the specified memory cells of the memory cell array 1 of the bank which is specified by the segment decoder 14 are sensed as data signals by a sense amplifier section 2. The data signals sensed by the sense amplifier section 2 are transferred directly to the data control circuit 4 via the bus 23 based on the signal DQM and the internal command. The latch circuit 6 latches the data signals in response to the clock signal from the clock generator 16 based on the signal DQM and the internal command to output to the input and output buffer 5. The data signals are outputted from the input and output buffer 5 as the signals DQ and DQS. Thus, the read data corresponding to the data signals is supplied to the control unit 50.

Also, in the write mode and the direct access mode, data signals corresponding to the write data from the control unit 50 are inputted to the input and output buffer 5 in response to the clock signal from the clock generator 16 and is latched by the latch circuit 6 in response to the clock signal from the clock generator 16 based on the signal DQM and the internal command. The latched data signals are transferred directly to the sense amplifier section 2 of the bank specified by the segment decoder 14, via the bus 23. Thus, the write data corresponding to the data signals are stored in memory cells connected to the word line specified by the row decoder 15 in the specified bank.

In the semiconductor memory device of the present invention, the bus 23 is added and the driver selection flag signal is externally inputted to the command decoder 8 via an external input terminal. Thus, the sense amplifier section 2 can be connected directly to the data control circuit 4. The expression "directly connect" implies that the sense amplifier section 2 is connected to the data control circuit 4 via the bus 23 without "via the channel memory 3 and the buses 21 and 22."

Since the bus 23 is employed, the read data corresponding to the data signals sensed by the sense amplifier section 2 may be directly outputted to an external circuit via the data control circuit 4, the latch circuit 6 and the input/output circuit 5. Also, the data signals corresponding to the write data supplied from the external circuit may be directly to the sense amplifier section 2 via the input/output circuit 5, the latch circuit 6 and the data control circuit 4.

The driver selection flag signal DSF can take a high-level state and a low-level state. The direct mode or the indirect mode can be set based on the internal command which is outputted from the control logic 9 based on the state of the driver selection flag signal DSF.

In case that the driver selection flag signal DSF is in the high level state and the internal command is the read command, the direct read access is executed so that data signals are outputted from the sense amplifier section 2 to the data control circuit 4 via the bus 23. In case that the driver selection flag signal DSF is in the high level state and the internal command is the write command, the direct write access is carried out so that data signals are transferred from the data control circuit 4 to the sense amplifier section 2 via the bus 23. Also, in case that the driver selection signal DSF is in the low level state and the internal command is the read command, the indirect read access is executed so that data signals are outputted from the sense amplifier section 2 to the data control circuit 4 via the bus 21, the channel memory 3 and the bus 22. In case that the driver selection flag signal is in the low level state and the internal command is the write command, the indirect write access is carried out so that data signals are transferred from the data control circuit 4 to the sense amplifier section 2 via the bus 22, the channel memory 3 and the bus 21.

Since the direct access is executed in a higher speed than that of the indirect access, the semiconductor memory device of the present invention can be effectively used for an image processing system in which row addresses are continuously changed. In this case, the control unit generates external direct access command. That is, the driver selection flag signal DSF to the command decoder 8 is set to the high level state.

Also, since the direct access mode is set in an internal test mode which is set by the mode register 17, it is not necessary to consider a delay time due to the channel memory into account. As a result, the measurement precision may be improved. In addition, in case that a failure occurs in the semiconductor memory device, it can be easily determined whether the failure occurs due to the memory cell or the channel memory.

In the above description, the direct access mode and the indirect access mode are switched based on the driver selection flag which is set based on the driver selection flag signal DSF. However, the switching operation may be accomplished based on a combination of the other signals supplied to the command decoder 8 and the address supplied to the address buffer 11. In this case, the direct access mode and the indirect access mode is set to the flag of the data control circuit 4 based on the combination of the other signals supplied to the command decoder 8 and the address supplied to the address buffer 11. Thus, the external input terminal for the driver selection flag signal DSF can be omitted.

As previously described, in accordance with the semiconductor memory device of the present invention, the two access modes are provided in the semiconductor memory device to attain the high speed access operation.

What is claimed is:

1. A semiconductor memory device, comprising:
a plurality of banks, each of which includes a memory cell array and a sense amplifier section;
a plurality of channel memories;
a data control circuit;
a first bus provided between said plurality of banks and said plurality of channel memories;
a second bus provided between said plurality of channel memories and said data control circuit; and
a third bus between said plurality of banks and said data control circuit, and
wherein said data control circuit outputs write data to said sense amplifier section of a specified one of said plurality of banks via said third bus in a direct write access mode, inputs read data from said sense amplifier section of a specified one of said plurality of banks via said third bus in a direct read access mode, outputs write data to said sense amplifier section of a specified one of said plurality of banks via said second bus, a specified one of said plurality of channel memories and said first bus in an indirect write access mode, and inputs read data from said sense amplifier section of a specified one of said plurality of banks via said first bus, a specified one of said plurality of channel memories and said second bus in an indirect read access mode.

2. A semiconductor memory device according to claim 1, wherein each of said first to third buses includes a bus driver, and
said bus drivers of said first and second buses are set to an enable state in said indirect write access mode and said indirect read access mode, and set to a disable state in said direct write access mode and said direct read access mode, and
said bus driver of said third bus is set to an enable state in said direct write access mode and said direct read access mode, and set to a enable state in said indirect write access mode and said indirect read access mode.

3. A semiconductor memory device according to claim 2, wherein said data control circuit includes a flag used to specify one of an indirect access mode and a direct access mode based on an access mode specify internal command, wherein said indirect access mode includes said indirect write access mode and said indirect read access mode, and said direct access mode includes said direct write access mode and said direct read access mode.

4. A semiconductor memory device according to claim 3, further comprising:
an internal command generating section generating said access mode specify internal command based on a signal supplied to a first specific external input terminal.

5. A semiconductor memory device according to claim 4, wherein said internal command generating section generates an operation mode specify internal command based on signals supplied to second specific external input terminals to set one of a write mode and a read mode.

6. A semiconductor memory device according to claim 3, further comprising:
an internal command generating section generating said access mode specify internal command based on signals supplied to specific external input terminals.

7. A method of accessing a semiconductor memory device, comprising:

setting a direct write access mode in response to a direct access internal command and a write internal command;
setting a direct read access mode in response to said direct access internal command and a read internal command;
setting an indirect write access mode in response to an indirect access internal command and said write internal command;
setting an indirect read access mode in response to said indirect access internal command and said read internal command;
accessing a specific memory cell array such that write data externally supplied is written into said specific memory cell array via a data control circuit, a first bus and a sense amplifier section for said specific memory cell array in said direct write access mode;
accessing said specific memory cell array such that read data is read out from said specific memory cell array via said sense amplifier section for said specific memory cell array, said first bus, and said data control circuit in said direct read access mode;
accessing said specific memory cell array such that said write data externally supplied is written into said specific memory cell array via said data control circuit, a second bus, a specific channel memory, a third bus and said sense amplifier section for said specific memory cell array in said indirect write access mode; and
accessing said specific memory cell array such that read data is read out from said specific memory cell array via said sense amplifier section for said specific memory cell array, said third bus, said specific channel memory, said second bus, and said data control circuit in said indirect read access mode.

8. A method according to claim 7, wherein each of said first to third buses includes a bus driver, and
wherein each of said setting a direct write access mode and said setting a direct read access mode includes:
setting said bus drivers of said second and third buses to a disable state; and
setting said bus drivers of said first bus to an enable state, and
wherein each of said setting an indirect write access mode and said setting an indirect read access mode includes:
setting said bus drivers of said second and third buses to an enable state; and
setting said bus drivers of said first bus to a disable state.

9. A method according to claim 7, further comprising:
selectively generating one of said direct access internal command and said indirect access internal command based on a signal supplied to a first specific external input terminal.

10. A method according to claim 9, further comprising:
selectively generating one of said write internal command and said read internal command based on signals supplied to second specific external input terminals.

11. A method according to claim 7, further comprising:
selectively generating one of said direct access internal command, said indirect access internal command, said write internal command and said read internal command based on signals supplied to second specific external input terminals.

12. A data processing system comprising:
a control unit determining whether or not data processing is to be executed for a data block, generating an external direct access command when it is determined that said data processing is to be executed for said data block, and generating an external indirect access command when it is determined that said data processing is not executed for said data block; and a semiconductor memory device setting one of an indirect write access mode, an indirect read access mode, a direct write access mode and a direct read access mode based on said external direct access command or said external direct access command, and whether said data processing relates to a write operation or a read operation, and wherein said semiconductor memory device comprises:

a plurality of banks, each of which includes a memory cell array and a sense amplifier section, and a specific one of said plurality of banks for said data block including a specific memory cell array and a specific sense amplifier section;

a plurality of channel memories;

a data control circuit;

a first bus provided between said plurality of banks and said plurality of channel memories;

a second bus provided between said plurality of channel memories and said data control circuit; and a third bus between said plurality of banks and said data control circuit, and wherein said data control circuit sends first write data of said data block from said control unit to said specific sense amplifier section via said third bus in said direct write access mode, receives first read data of said data block from said specific sense amplifier section via said third bus in said direct read access mode, sends second write data to said sense amplifier section of a specified one of said plurality of banks via said second bus, a specified one of said plurality of channel memories and said first bus in said indirect write access mode, and receives second read data from said sense amplifier section of a specified one of said plurality of banks via said first bus, a specified one of said plurality of channel memories and said second bus in said indirect read access mode.

13. A data processing system according to claim 12, wherein each of said first to third buses includes a bus driver, and said bus drivers of said first and second buses are set to an enable state in said indirect write access mode and said indirect read access mode, and set to a disable state in said direct write access mode and said direct read access mode, and said bus driver of said third bus is set to an enable state in said direct write access mode and said direct read access mode, and set to a enable state in said indirect write access mode and said indirect read access mode.

14. A data processing system according to claim 13, wherein said data control circuit includes a flag used to specify one of an indirect access mode and a direct access mode based on an access mode specify internal command, wherein said indirect access mode includes said indirect write access mode and said indirect read access mode, and said direct access mode includes said direct write access mode and said direct read access mode.

15. A data processing system according to claim 14, wherein said semiconductor memory device further comprises:

an internal command generating section generating said access mode specify internal command based on said external indirect access command or said external direct access command from said control unit.

16. A data processing system according to claim 15, wherein said internal command generating section generates an operation mode specify internal command based on whether said data processing is for said write operation and said read operation.

* * * * *